(12) United States Patent
Lukaitis et al.

(10) Patent No.: US 8,652,922 B2
(45) Date of Patent: Feb. 18, 2014

(54) COMPACT THERMALLY CONTROLLED THIN FILM RESISTORS UTILIZING SUBSTRATE CONTACTS AND METHODS OF MANUFACTURE

(75) Inventors: Joseph M. Lukaitis, Pleasant Valley, NY (US); Jed H. Rankin, Richmond, VT (US); Robert R. Robison, Colchester, VT (US); Dustin K. Slisher, Wappingers Falls, NY (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 13/008,459

(22) Filed: Jan. 18, 2011

(65) Prior Publication Data

US 2012/0181663 A1   Jul. 19, 2012

(51) Int. Cl.
  *H01L 21/20*   (2006.01)
(52) U.S. Cl.
  USPC ........................................... 438/384; 438/385
(58) Field of Classification Search
  USPC .................................. 438/384, 385, E21.004
  See application file for complete search history.

(56) References Cited

U.S. PATENT DOCUMENTS

| | | | |
|---|---|---|---|
| 5,640,137 A | 6/1997 | Mantha | |
| 5,793,097 A | 8/1998 | Shimamoto et al. | |
| 6,563,214 B2 | 5/2003 | Yamada et al. | |
| 7,253,074 B2 | 8/2007 | Park | |
| 7,365,397 B2 | 4/2008 | Nomura | |
| 7,375,001 B2 * | 5/2008 | Hasegawa | 438/384 |
| 8,298,904 B2 * | 10/2012 | Lukaitis et al. | 438/384 |
| 2001/0026968 A1 | 10/2001 | Sung et al. | |
| 2003/0219956 A1 | 11/2003 | Mori et al. | |
| 2004/0152268 A1 | 8/2004 | Chu et al. | |
| 2005/0106805 A1 * | 5/2005 | Olson | 438/238 |
| 2011/0057267 A1 | 3/2011 | Chuang et al. | |
| 2011/0073957 A1 | 3/2011 | Chiu et al. | |
| 2012/0184080 A1 | 7/2012 | Lukaitis et al. | |

FOREIGN PATENT DOCUMENTS

| | | |
|---|---|---|
| JP | 2283058 | 11/1990 |
| JP | 3171657 | 7/1991 |
| JP | 3248458 | 11/1991 |
| JP | 7142677 | 6/1995 |
| JP | 2000150780 | 5/2000 |
| JP | 2001257317 | 9/2001 |

OTHER PUBLICATIONS

Notice of Allowance dated Jun. 26, 2012 in U.S. Appl. No. 13/008,465.
Notice of Allowance dated May 10, 2013 in U.S. Appl. No. 13/588,218; 8 Pages.

* cited by examiner

*Primary Examiner* — Howard Weiss
*Assistant Examiner* — Steven Rao
(74) *Attorney, Agent, or Firm* — David Cain; Roberts Mlotkowski Safran & Cole, P.C.

(57) ABSTRACT

A method of forming a semiconductor structure includes forming a resistor on an insulator layer over a substrate and forming a trench in the resistor and into the substrate. The method also includes forming a liner on sidewalls of the trench and forming a core comprising a high thermal conductivity material in the trench and on the liner.

19 Claims, 9 Drawing Sheets

COMPACT THERMALLY CONTROLLED THIN FILM RESISTORS UTILIZING SUBSTRATE CONTACTS AND METHODS OF MANUFACTURE

FIELD OF THE INVENTION

The invention relates to semiconductor structures and methods of manufacture and, more particularly, to thermal control of thin film resistors using substrate contacts and methods of manufacture.

BACKGROUND

Specific structures on silicon-on-insulator (SOI) substrates tend to have problems with heat accumulation from self-heating due to the very low thermal conductivity of the SOI substrate. This presents particular issues with the maximum allowed current density of thermally sensitive structures. The heat accumulation presents particular problems with DC structures such as, for example, some precision resistors (e.g., thin film resistors).

Precision resistors are in general use in Si-based microelectronics integrated circuit chips. These resistors are frequently fabricated from polysilicon layers deposited on the chip, but they can also be made from diffused silicon (Si) layers in SOI wafers. These resistors produce heat when current flows through them. In particular, polysilicon and diffused resistors, especially those formed on SOI wafers, heat up rapidly with increasing current density. Although the resistor itself can tolerate relatively high temperatures without suffering damage, wiring on the various metallization levels above and nearby the resistors becomes much more vulnerable to failure by electromigration due to the heating caused by the resistor. Generally, a temperature increase of 5° C. in a metal line can decrease the lifetime of the line by 25 to 30%. The generated heat can also permanently alter the value of the resistance of the resistor by changing the grain size of the polysilicon, by burning out portions (or all) of the film and by redistributing the dopant atoms. Consequently, limiting the current through the resistor protects both the resistor stability and the integrity of the nearby metallization.

However, limiting the current through a resistor is at odds with the continued drive toward circuit miniaturization and the trend toward progressively greater current densities for high-performance circuits. The miniaturization of features typically involves reducing the film thickness in which resistors are formed, which tends to increase current density, which causes the resistor to generate more heat.

Accordingly, there exists a need in the art to overcome the deficiencies and limitations described hereinabove.

SUMMARY

In a first aspect of the invention, a method of forming a semiconductor structure comprises forming a resistor on an insulator layer over a substrate and forming a trench in the resistor and into the substrate. The method also includes forming a liner on sidewalls of the trench and forming a core comprising a high thermal conductivity material in the trench and on the liner.

In another aspect of the invention a method of forming a semiconductor structure comprises forming a substrate contact trench through an insulator layer and into a substrate, and forming a core comprising a high thermal conductivity material in the substrate contact trench. The method also comprises forming a capping layer on the core, and forming a resistor on the capping layer and the insulator layer.

In yet another aspect of the invention, a semiconductor structure comprises a resistor on an insulator layer over a substrate, and a substrate contact extending through the resistor, through the insulator layer, and into the substrate. The substrate contact comprises a liner composed of electrical insulator material and a core composed of a high thermal conductivity material. The liner electrically insulates the resistor from the core.

In yet another aspect of the invention, a semiconductor structure comprises a substrate contact extending through an insulator layer and into a substrate. The substrate contact comprises a core composed of a high thermal conductivity material and a capping layer composed of an electrical insulator. The structure also comprises a resistor formed on the capping layer and the insulator layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a resistor and substrate contact, which comprises the structures of the present invention. In still further embodiments, a method in a computer-aided design system is provided for generating a functional design model of the resistor and substrate contact. The method comprises generating a functional representation of the structural elements of the resistor and substrate contact.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
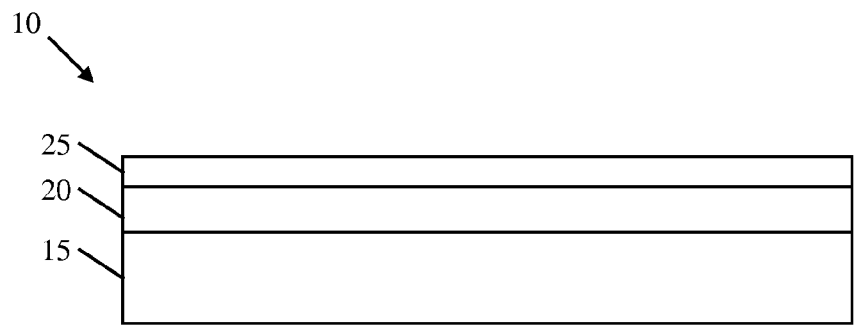
FIGS. 1-14 show processing steps and structures in accordance with aspects of the invention.

The invention relates to semiconductor structures and methods of manufacture and, more particularly, to thermal control of thin film resistors using substrate contacts and methods of manufacture. In accordance with aspects of the invention, a substrate contact is formed through the body of the resistor. In embodiments, the substrate contact is electrically isolated from the resistor and provides a low thermal resistance heat path from the resistor to the substrate. In implementations, the substrate contact comprises a liner composed of an electrical insulator material and a core composed of a high thermal conductivity material. In this manner, implementations of the invention provide a low thermal resistance heat dissipation path from a resistor to a substrate, which enhances the thermal control (e.g., cooling) of the resistor.

In accordance with additional aspects of the invention, a metal layer is provided over the resistor and a metal contact is provided between the metal layer and the core of the substrate contact. In this manner, heat that is generated by the resistor and flows upward through the insulator above the resistor is captured by the metal layer and channeled to the substrate through the metal contact and substrate contact.

Resistive heating is a physical consequence of electric current passing through the material of a resistor. Polysilicon resistors typically reside on an insulator layer (e.g., $SiO_2$ or similar material) above an Si substrate. Heat generated in the resistor spreads by thermal conduction into the surrounding oxide and from the oxide into the Si substrate. Heat generated during resistive heating may flow directly through the oxide between the resistor and the substrate. The heat may also flow out of the top and the side edges of the resistor. As such, there are top, side, and bottom heat conduction paths from the resistor. Most of the heat generated in a resistor flows into the Si substrate through the underlying shallow trench isolation (STI) and buried oxide (BOX) films. Heat that flows upward is typically dissipated by flowing laterally and then back to the substrate, which constitutes a much more thermally resistive path than simply flowing out beneath the resistor.

Implementations of the invention provide a heat dissipation path from the resistor to the substrate by providing a substrate contact through an active area of the resistor and into the substrate. In accordance with aspects of the invention, the substrate contact comprises a high thermal conductivity material having a lower thermal resistance than the STI and/or BOX materials that heat typically flows through when dissipating from a resistor. The substrate contact need not be electrically connected to any other devices in the chip, and may be used primarily as a heat conduction pathway for transferring heat away from the resistor. In embodiments, the substrate contact provides a thermal conduction path from the resistor to the substrate, and thus reduces the resistor temperature significantly. In this manner, a resistor may be cooled more effectively, which advantageously permits the current density in the resistor to be increased.

FIGS. 1-14 show processing steps and structures in accordance with aspects of the invention. Specifically, FIG. 1 shows an exemplary SOI wafer 10 employed as an intermediate structure in implementations of the invention. The SOI wafer 10 has a bulk semiconductor substrate 15, which is typically a silicon substrate, a buried insulator layer 20 formed on the substrate 15, and a semiconductor layer 25, which is typically a silicon layer, formed on the buried insulator layer 20. The SOI wafer 10 may be fabricated using techniques well know to those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 15 may be composed of any suitable material including, but not limited to, Si, SiGe, SiGeC, SiC, GE alloys, GaAs, InAs, InP, and other III/V or II/VI compound semiconductors. The buried insulator layer 20 may be composed of oxide, such as $SiO_2$, and may be referred to as a buried oxide (BOX) layer 20. Moreover, although the SOI wafer is referred to as "silicon on insulator," the semiconductor layer 25 is not limited to silicon. Instead, the semiconductor layer 25 may be comprised of various semiconductor materials, such as, for example, Si, SiGe, SiC, SiGeC, etc.

In embodiments, the SOI wafer 10 has a thickness of about 700 μm, with the BOX layer 20 having a thickness of about 0.15 μm, and the semiconductor layer 25 having a thickness of about 0.08 μm. However, the invention is not limited to these dimensions, and the various portions of the SOI wafer may have any desired thicknesses based upon the intended use of the final semiconductor device.

Figure 2:
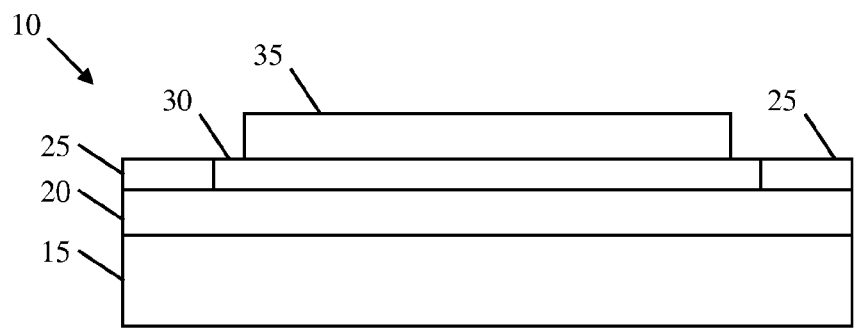

As shown in FIG. 2, a shallow trench isolation (STI) structure 30 is formed in the wafer 10, and a resistor 35 is formed on the STI 30. The STI 30 may be a conventional shallow trench isolation structure formed using conventional semiconductor fabrication processes and materials. For example, the STI 30 may be formed by arranging a photoresist material on the semiconductor layer 25, exposing and developing the photoresist, etching an STI trench in the semiconductor layer 25 through the patterned photoresist (e.g., using a reactive ion etch (RIE) process), stripping the photoresist, filling the trench with an STI material (e.g., $SiO_2$), and planarizing the top surface of the structure (e.g., via chemical mechanical polish (CMP)). The STI 30 locally replaces a portion of the semiconductor layer 25.

Still referring to FIG. 2, the resistor 35 may also be formed using conventional semiconductor fabrication processes and materials. For example, the resistor 35 may comprise electrically conductive doped polysilicon and may be formed by depositing a polysilicon film on the STI 30 (e.g., using chemical vapor deposition (CVD)), patterning the polysilicon film (e.g., using photolithographic masking and etching), and doping the polysilicon film (e.g., using ion implantation, gas diffusion doping, in-situ doping, etc.).

Figure 3:
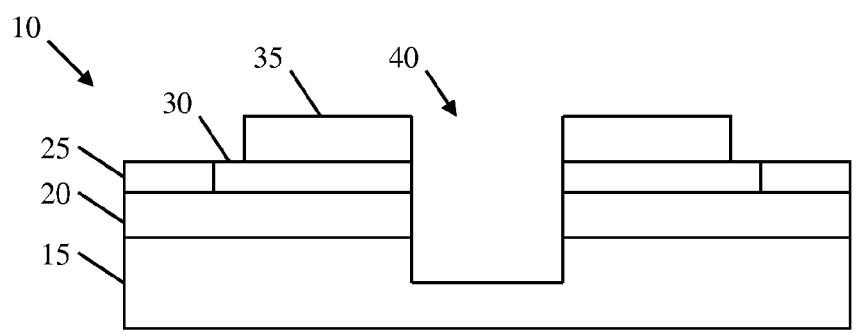

In accordance with aspects of the invention, and as shown in FIG. 3, a substrate contact trench 40 is formed in the resistor 35, the STI 30, the BOX layer 20, and into the substrate 15. In embodiments, the substrate contact trench 40 is formed using one or more RIE processes. For example, a respective RIE process may be performed for etching each of the resistor 35, the STI 30, the BOX layer 20, and the substrate 15, with each respective RIE process being tailored to the material of the layer/feature being etched. Additionally, a single RIE process may be used to etch more than one layer/feature.

The substrate contact trench 40 may have any desired size and shape, and more than one substrate contact trench 40 may be formed. In accordance with aspects of the invention, the substrate contact trench 40 may be located anywhere within or overlapping the footprint (e.g., top-down plan view) of the resistor 35. In embodiments, the substrate contact trench 40 creates a hole through the resistor 35, but does not bisect the resistor 35.

Figure 4:
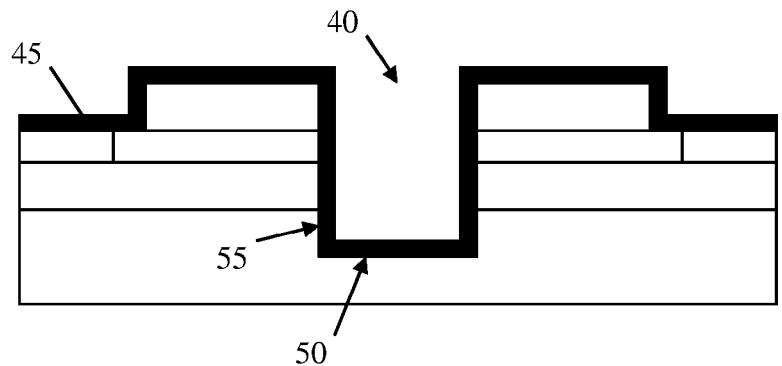

As shown in FIG. 4, an insulator film 45 (e.g., liner) is formed on exposed surfaces of the structure, including a base 50 and sidewalls 55 of the substrate contact trench 40. In embodiments, the insulator film 45 is composed of an electrically non-conductive material, such as oxide, nitride, oxynitride, or other dielectric material. The insulator film 45 may be formed using conventional semiconductor fabrication processes, depending on the material composition of the insulator film 45. For example, the insulator film 45 may be composed of oxide that is thermally grown (e.g., thermal oxidation) on the exposed surfaces of the structure. In another example, the insulator film 45 may be composed of oxide, nitride, or oxynitride that is deposited using CVD or other suitable conformal deposition process. The insulator film 45 may have any suitable thickness, as described in greater detail herein.

Figure 5:
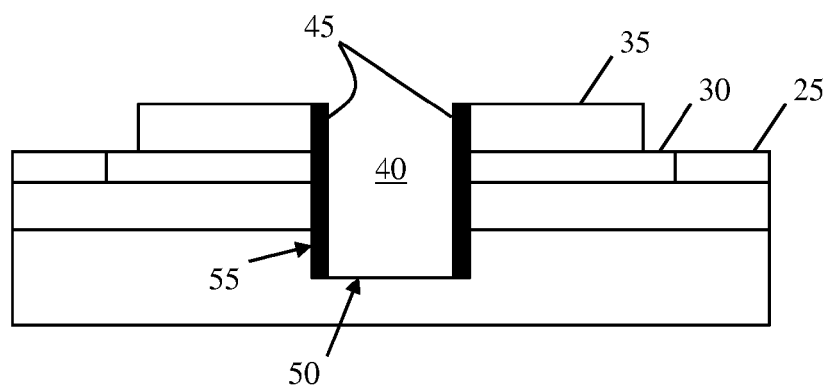

As shown in FIG. 5, and in accordance with aspects of the invention, a portion of the insulator film 45 is removed from the base 50 of the substrate contact trench 40, while leaving another portion of the insulator film 45 on the sidewalls 55 of the substrate contact trench 40. In embodiments, a directional RIE process is used to remove the portion of the insulator film 45 from the base 50; however, other suitable removal processes may be used within the scope of the invention. The removal process may also remove the insulator film 45 from the top of the resistor 35, STI 30, and semiconductor layer 25.

Figure 6:
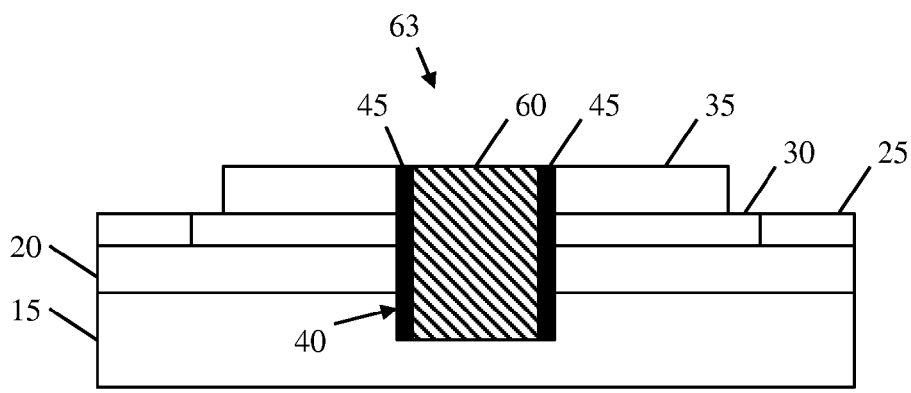

As depicted in FIG. 6, a core 60 is formed in the substrate contact trench 40 on the insulator film 45. In accordance with aspects of the invention, the core 60 comprises a high thermal conductivity material including, but not limited to, polysilicon, tungsten, copper, aluminum, silver, gold, and combinations thereof. In embodiments, the core 60 is composed of polysilicon and is formed using a CVD process, although other high thermal conductivity materials may be provided using other formation processes. More specifically, according to aspects of the invention, the core 60 is composed of any suitable material that has a thermal conductivity that is substantially greater than the thermal conductivity of the material (s) of the BOX layer 20 and STI 30 (e.g., $SiO_2$). Table 1 shows the thermal conductivity of various materials.

TABLE 1

| Material | Thermal Conductivity (w/m · K) |
| --- | --- |
| Glass (e.g., $SiO_2$) | 1.1 |
| Silicon | 149 |
| Tungsten | 173 |
| Aluminum (pure) | 237 |
| Gold | 318 |
| Copper | 401 |
| Silver | 429 |

As is evident from Table 1, polysilicon (e.g., silicon), tungsten, copper, aluminum, silver, and gold each has a thermal conductivity substantially greater than that of $SiO_2$, and thus may be considered as high thermal conductivity materials. Accordingly, in embodiments, the core 60 is composed of polysilicon, tungsten, copper, aluminum, silver, gold, or combinations thereof. In accordance with aspects of the invention, the substrate contact trench 40 that is filled with the insulator film 45 and the core 60 constitutes a substrate contact 63 that provides a heat conduction pathway from the resistor 35 to the substrate 15.

The deposition of the core 60 may result in the formation of excess material on upper surfaces of the structure. The excess material may be removed using a conventional material removal process, such as an endpoint etch or CMP process.

Figure 7:
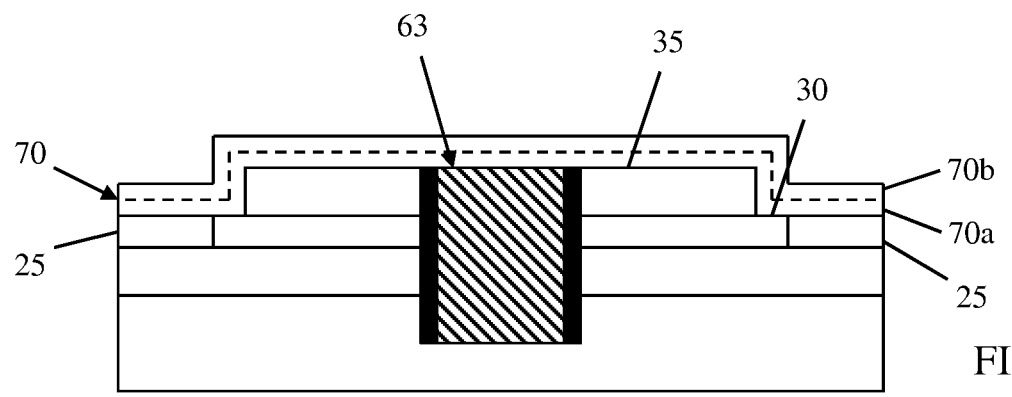

As shown in FIG. 7, a first dielectric layer 70 is formed over the resistor 35, the substrate contact 63, and portions of the semiconductor layer 25 and STI 30. The first dielectric layer 70 may be formed using conventional semiconductor fabrication processes and materials. For example, the first dielectric layer 70 may comprise one or more layers of oxide, nitride, and oxynitride that are formed using, e.g., CVD. In embodiments, the first dielectric layer 70 comprises a thin oxide film 70a formed on the resistor 35 and portions of the semiconductor layer 25 and STI 30, and a nitride layer 70b deposited on the oxide film 70a. The oxide film 70a may have a thickness of about 3 nm, and the nitride layer 70b may have a thickness of about 20-30 nm, although the invention is not limited to these dimensions and any suitable thicknesses may be employed within the scope of the invention.

Figure 8:
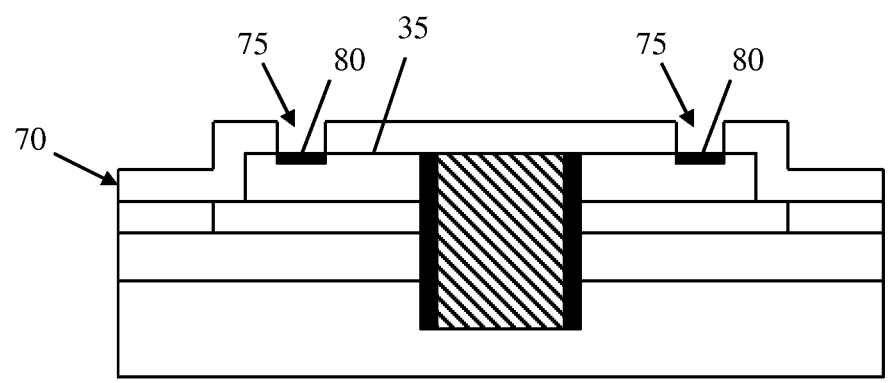

As shown in FIG. 8, holes 75 are formed in the first dielectric layer 70, and silicide contacts 80 are formed on the resistor 35. The holes 75 are formed in the first dielectric layer 70 to define locations for the silicide contacts 80. The holes 75 and silicide contacts 80 may be formed using conventional semiconductor fabrication processes and materials. For example, the holes 75 may be formed by photolithographic masking and etching, laser ablation, gas cluster ion beam, etc. The silicide contacts 80 may be formed by depositing a metal film, such as cobalt, titanium, tungsten, or nickel, on the exposed polysilicon of the resistor 35 within the holes 75, and annealing the structure to create silicide.

Figure 9:
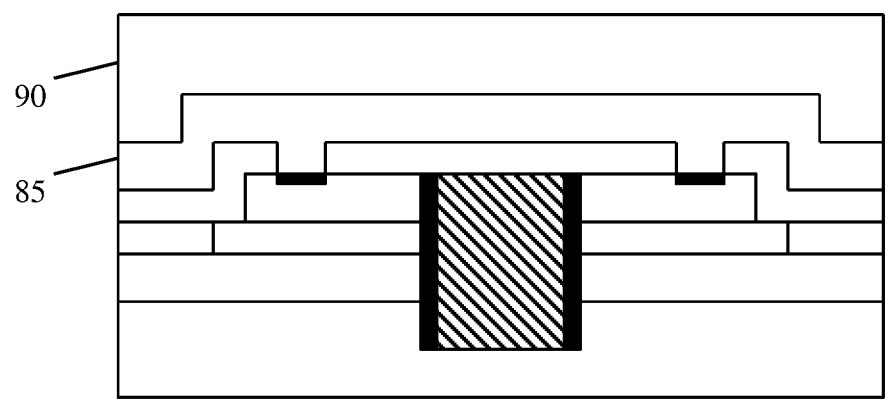

As shown in FIG. 9, a second dielectric layer 85 is formed on the exposed surfaces of the structure, and a third dielectric layer 90 is formed on the second dielectric layer 85. The second and third dielectric layers 85 and 90 may be composed of any suitable dielectric materials and may be formed using conventional semiconductor fabrication techniques, such as CVD (e.g., a conformal deposition). In embodiments, the second dielectric layer 85 is composed of nitride, and the third dielectric layer 90 is composed of silicon dioxide ($SiO_2$), borophosphosilicate glass (BPSG), or low-k dielectric material; however, the invention is not limited to this configuration and other combinations of materials may be used within the scope of the invention.

Figure 10:
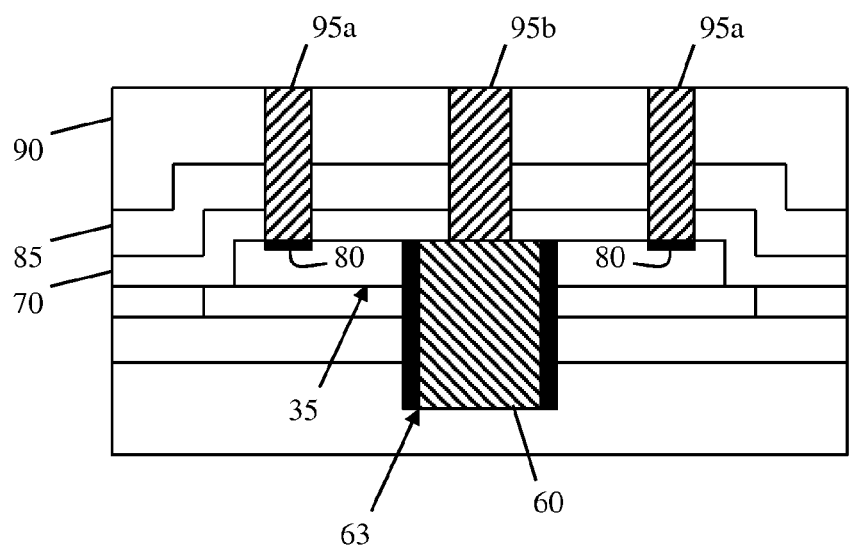

As shown in FIG. 10, resistor contacts 95a and thermal contact 95b are formed in the layers 70, 85, and 90. In accordance with aspects of the invention, the resistor contacts 95a provide electrical contact to the resistor 35 by directly contacting the silicide contacts 80, and the thermal contact 95b provides a thermal conduction pathway to the substrate contact 63. In embodiments, the resistor contacts 95a and thermal contact 95b are formed simultaneously using the same processing steps, e.g., by forming trenches in the dielectric layers 70, 85, and 90 and filling the trenches with an electrically conductive material.

For example, trenches for the resistor contacts 95a and thermal contact 95b may be formed in the dielectric layers 70, 85, and 90 by masking the structure and etching unmasked portions of the dielectric layers 70, 85, and 90 using one or more conventional etch processes (e.g., RIE). A respective RIE process may be performed for etching each of the dielectric layers 70, 85, and 90, with each respective RIE process being tailored to the material of the layer being etched. Alternatively, a single RIE process may be used to etch more than one layer. The masking defines where the trenches are located, and appropriate masking may be used to form respective trenches over the silicide contacts 80 (e.g., for the resistor contacts 95a) and the core 60 (e.g., for the thermal contact 95b).

The resistor contacts 95a and thermal contact 95b, in turn, may be formed by depositing (e.g., using CVD) an electrically conductive material (e.g., tungsten) in the trenches. In embodiments, the resistor contacts 95a may be in the form of a plurality of vias (e.g., an array of small pillars with a minimum diameter dependent on the technology, for example 0.25 µm in diameter) or in the form of a solid bar.

In accordance with aspects of the invention, the use of multiple dielectric layers (e.g., dielectric layers 70, 85, and 90) facilitates the simultaneous creation of the resistor contacts 95a and thermal contact 95b. The multiple dielectric layer overlap causes the etch of the contact trenches to self arrest, such that the etch does not etch through the whole nitride stack. Moreover, using nitride in dielectric layers 70 and 85 enhances the heat conduction since nitride is generally a better thermal conductor than oxide.

Figure 11:
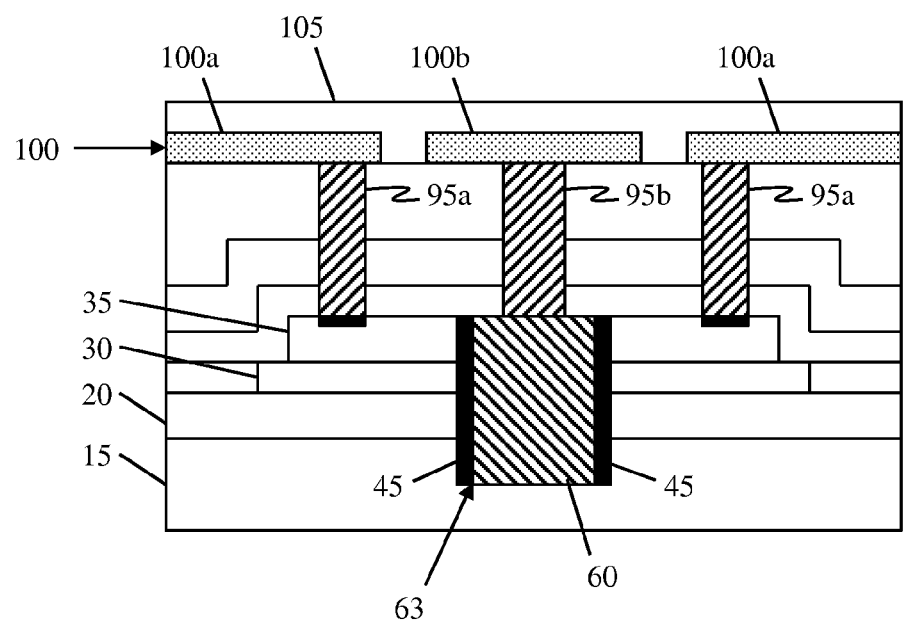

As shown in FIG. 11, metal layer 100 is formed on the third dielectric layer 90, and an interlevel dielectric (ILD) 105 is formed over the entire structure. The metal layer 100 may be formed in any conventional manner, such as, for example, CVD and patterning (e.g., masking and etching). The metal layer 100 may be a layer of copper (Cu) or any other desired electrically conductive material. In accordance with aspects of the invention, the metal layer 100 is patterned to have separate segments 100a and 100b. Segments 100a are connected to the resistor contacts 95a and provide electrical communication to the resistor 35. Segment 100b is connected to the thermal contact 95b and is configured to collect heat that dissipates upward from the resistor and channel the collected heat to the substrate 15 through the thermal contact 95b and core 60. Segment 100b is electrically insulated from portions 100a by the ILD 105. The ILD 105 may be formed using conventional semiconductor fabrication techniques, and may be composed of any suitable dielectric material, such as silicon dioxide ($SiO_2$), tetraethylorthosilicate (TEOS), borophosphosilicate glass (BPSG), hydrogen silsesquioxane (HSQ), etc.

In accordance with aspects of the invention, the metal layer segment 100b, thermal contact 95b, and substrate contact 63 are structured and arranged as a heat conduction structure that transfers heat generated by the resistor 35 to the substrate 15. The insulator film 45 electrically insulates the resistor 35 from the core 60, such that an electrically conductive material may be used as the high thermal conductivity material in the core 60 without shorting the resistor 35. In embodiments, the insulator film 45 has a thickness that is sufficient to provide electrical insulation between the resistor 35 and the core 60, and that is less than the combined thickness of the STI 30 and BOX layer 20. By being less thick (e.g., thinner) than the STI 30 and BOX layer 20, the insulator film 45 provides less thermal resistance than the STI 30 and BOX layer 20, such that heat may flow through the insulator film 45 and core 60 and into the substrate 15. In particular embodiments, the insulator film 45 has a thickness "t" of about 0.03 μm to about 0.1 μm, although the invention is not limited to this range and any suitable thickness may be used.

In implementations, the resistor 35 and the substrate contact 63 may be of any desired size and shape. For example, the resistor 35 may be substantially rectangular with a width of about 10 μm (e.g., perpendicular to the direction of current flow between the silicide contacts 80) and a length of about 2 μm (e.g., parallel to the direction of current flow between the silicide contacts 80), and the substrate contact 63 may have a width of about 0.5 μm and a length of about 0.5 μm. However, the invention is not limited to this exemplary configuration, and any suitable size and shape may be used for the resistor 35 and the substrate contact 63. Moreover, the respective sizes and shapes of the resistor 35 and the substrate contact(s) 63 may be tailored to achieve a particular electrical resistance and heat transfer for the resistor 35.

Figure 12:
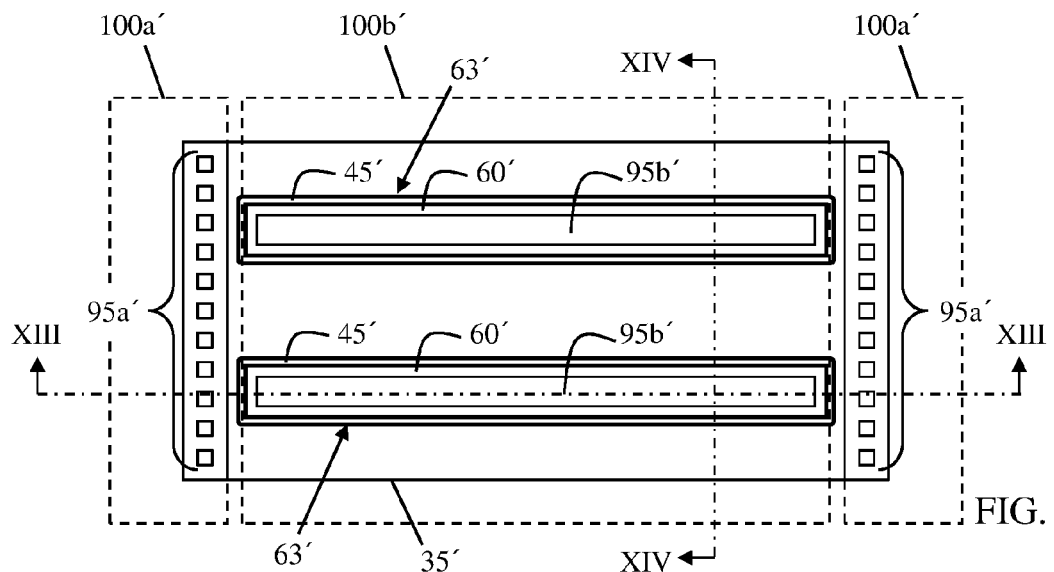
Figure 13:
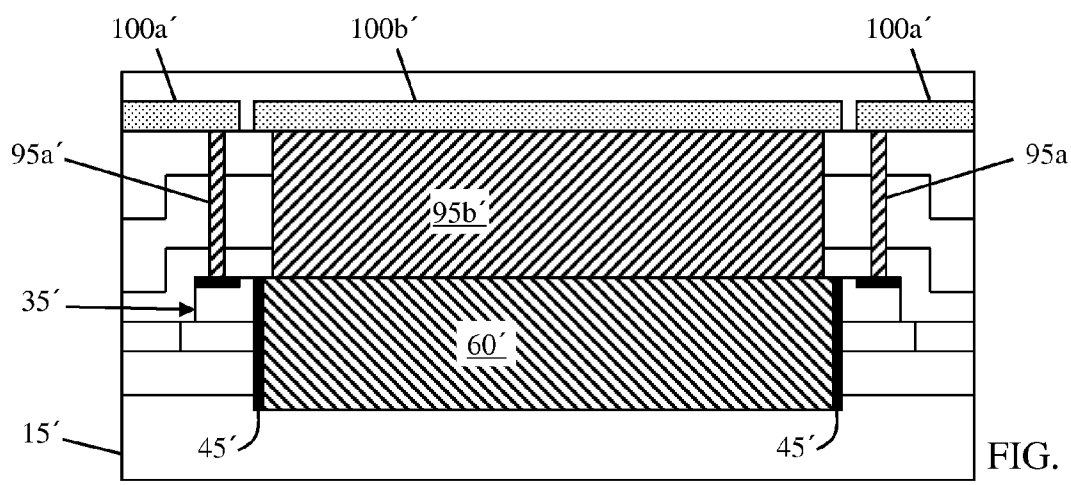
Figure 14:
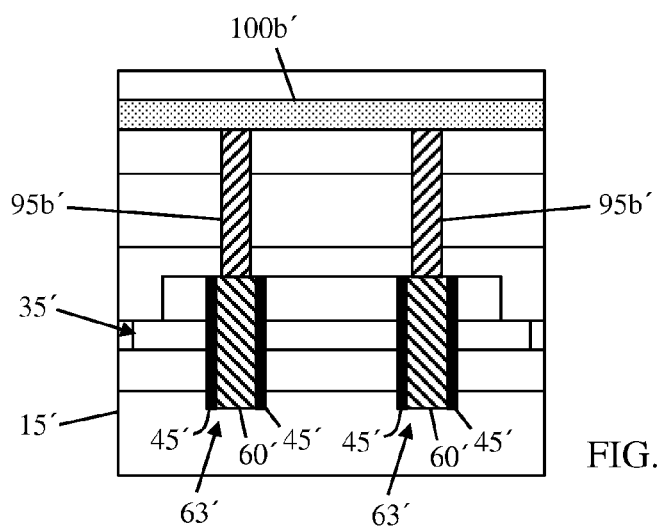

For example, FIGS. 12-14 show an implementation comprising two substrate contacts 63' having an elongated shape parallel to the direction of current flow in the resistor 35'. More specifically, FIG. 12 shows a plan view of the substrate contacts 63' and thermal contacts 95b' extending parallel to the direction of current flow between resistor contacts 95a'. FIG. 13 shows a cross section along line XIII-XIII of FIG. 12, and FIG. 14 shows a cross section along line XIV-XIV of FIG. 12. As can be seen in FIGS. 12-14, the liners 45' insulate the cores 60' from the resistor 35', and the ILD 105' insulates metal layer segment 100b' from segments 100a'. In accordance with aspects of the invention, the metal layer segment 100b' covers substantially the entire resistor 35'. In this manner, the metal layer segment 100b' contacts both thermal contacts 95b' and captures substantially all of the heat that dissipates upward from the resistor, and conducts this heat to the substrate 15' via the thermal contacts 95b' and cores 60'.

Figure 15:
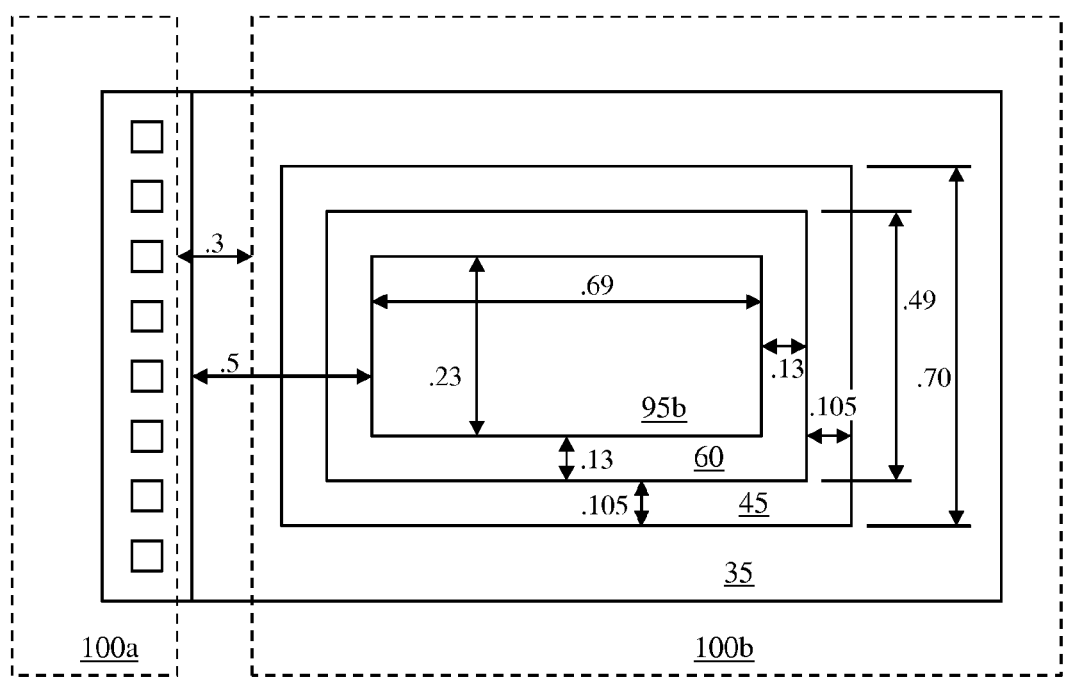
FIG. 15 shows a design diagram in accordance with aspects of the invention.

FIG. 15 shows an exemplary design detail for the structures shown in FIGS. 1-14 in accordance with aspects of the invention. As shown in FIG. 15, the minimum spacing between the resistor 35 and the core 60 may be about 0.105 μm in both the width and length direction. The minimum spacing between the edges of the core 60 and the edges of the thermal contact 95b may be about 0.13 μm in both the width and length directions. The minimum lengthwise spacing between edges of the thermal contact 95b may be about 0.69 μm, and the minimum widthwise spacing between edges of the thermal contact 95b may be about 0.23 μm. The minimum widthwise spacing between edges of the core 60 may be about 0.49 μm. The minimum widthwise spacing between edges of the resistor 35, e.g., bounding the substrate contact, may be about 0.70 μm. The minimum spacing between the metal layer segment 100a and segment 100b may be about 0.3 μm. The minimal lengthwise spacing between the thermal contact 95b and the silicide contacts 50 may be about 0.5 μm. It is understood that these values are merely exemplary, and other spacings may be used within the scope of the invention.

Figure 16:
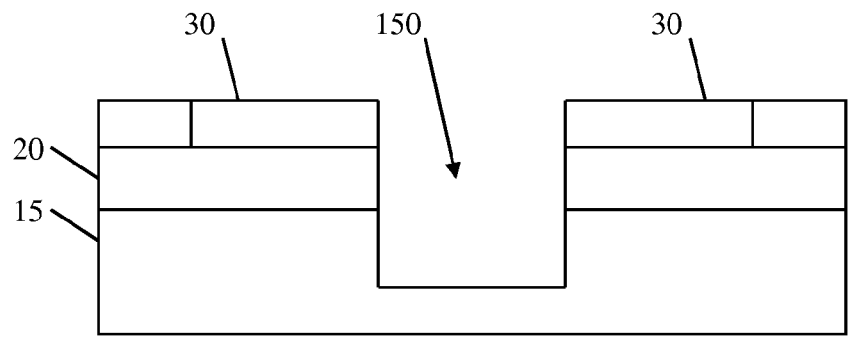
FIGS. 16-20 show processing steps and structures in accordance with additional aspects of the invention.

FIGS. 16-20 show processing steps and structure in accordance with additional aspects of the invention in which like reference characters refer to the same features already described herein. In particular, FIG. 16 shows a substrate contact trench 150 formed in the STI 30 and BOX layer 20 and into the substrate 15. The substrate contact trench 150 may be formed using, for example, masking (e.g., photolithography) and etching (e.g., RIE). In embodiments, the substrate contact trench 150 is formed prior to the resistor.

Figure 17:
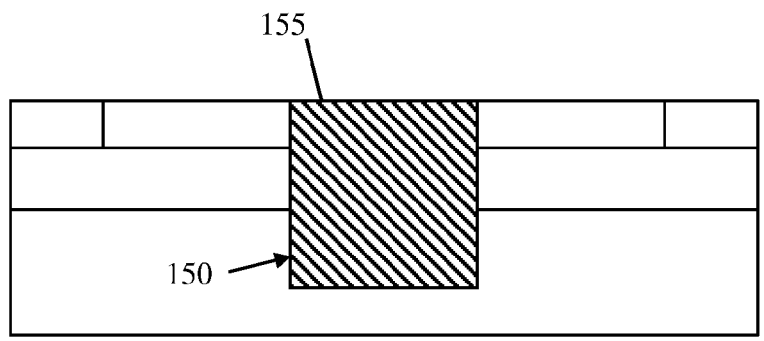

As shown in FIG. 17, the substrate contact trench 150 is filled with a core 155 comprising a high thermal conductivity material. The core 155 may be formed in the same manner (e.g., CVD) and with the same materials (e.g., tungsten, polysilicon, etc.) as core 60 described with respect to FIG. 6. The top surface of the structure may be planarized using, e.g., CMP or an etch, following the formation of the core 155.

Figure 18:
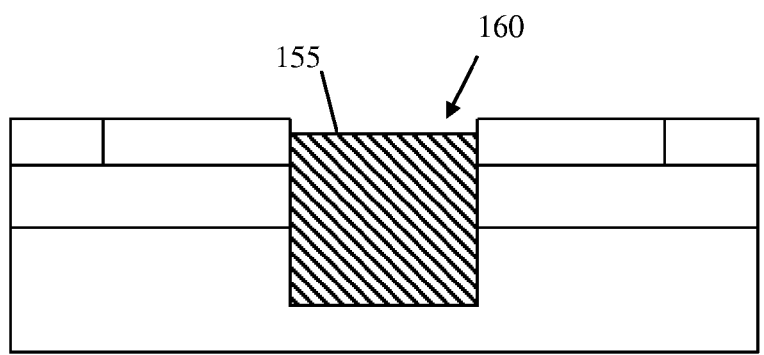

As shown in FIG. 18, the core 155 is recessed to form a trench 160. The trench 160 may be formed using any suitable technique, such as a timed etch of the core 155 material. In embodiments, the trench 160 has a depth of about 0.03 to 0.1 μm, although the trench 160 may be formed to any suitable depth.

Figure 19:
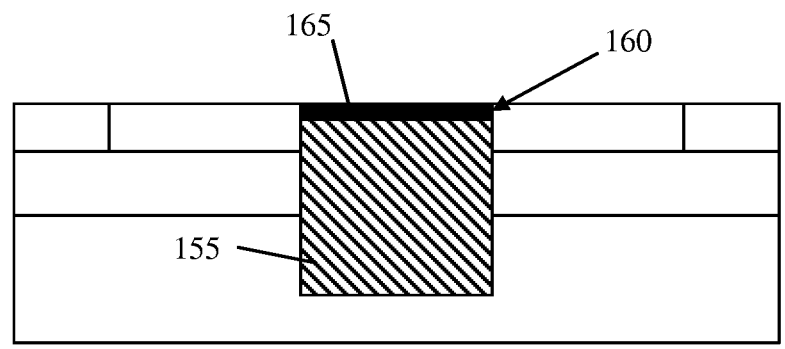

As shown in FIG. 19, an electrically insulating capping layer 165 is formed in the trench 160 on the core 155. The capping layer 165 may be formed using conventional semiconductor fabrication processes and materials. For example, the capping layer 165 may be composed of any desired electrical insulator, such as oxide, nitride, oxynitride, or other dielectric materials. Moreover, the capping layer 165 may be formed using, for example, thermal oxidation, CVD, etc. After forming the capping layer 165, the structure may be planarized, e.g., using CMP.

Figure 20:
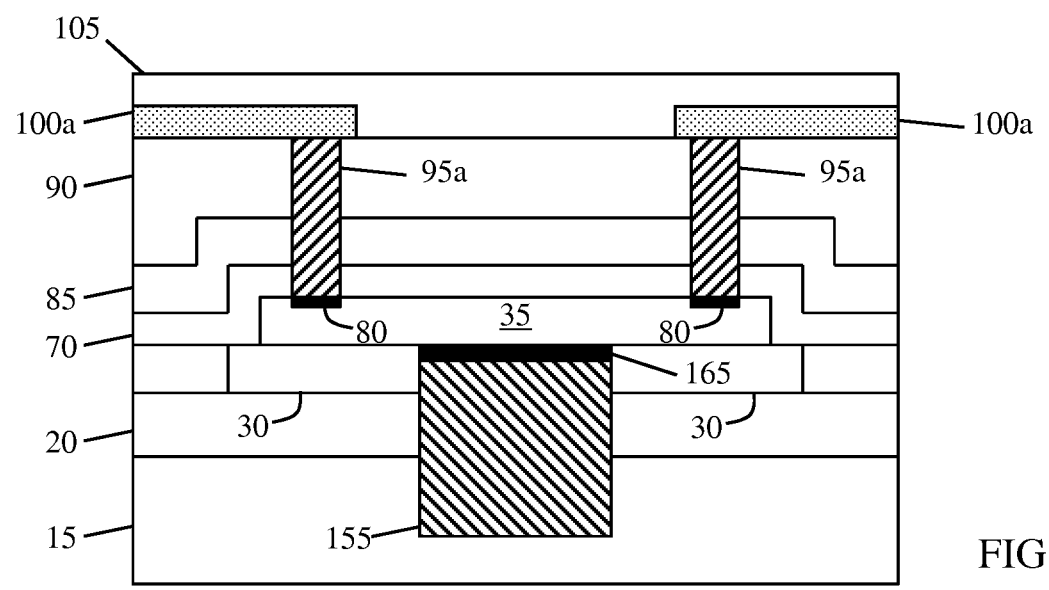

As shown in FIG. 20, a resistor 35 is formed on the STI 30 and the capping layer 165. Additionally, a first dielectric layer 70 is formed on the resistor 35, silicide contacts 80 are formed on the resistor 35, a second dielectric layer 85 is formed over the first dielectric layer 70, a third dielectric layer 90 is formed on the second dielectric layer 85, resistor contacts 95a are formed in the dielectric layers, metal layer segments 100a are formed in contact with the resistor contacts 95a, and ILD 105 is formed over the metal layer segments 100a. The resistor 35, dielectric layers 70, 85, and 90, silicide contacts 80, resistor contacts 95a, metal layer segments 100a, and ILD 105 may be formed in the same manner as described with respect to FIGS. 2-11.

In accordance with aspects of the invention, the capping layer 165 electrically insulates the resistor 35 from the core 155. In embodiments, the capping layer 165 has a thickness less than the combined thickness of the STI 30 and BOX layer 20. In this manner, a heat conduction path from the resistor 35 to the substrate 15 through the capping layer 165 and the high thermal conductivity core 155 has a lower thermal resistance than a heat conduction path from the resistor 35 to the substrate 15 through the STI 30 and BOX layer 20.

Aspects of the invention have been described with respect to a polysilicon resistor formed on an SOI wafer. The invention is not limited to this particular type of resistor, however, and implementations of the invention may be used with any type of resistor. For example, a substrate contact in accordance with aspects of the invention may be formed through a diffused resistor (e.g., formed directly on the BOX layer of an SOI wafer) or a refractory metal resistor (e.g., formed on an ILD layer). Moreover, the invention is not limited to use with SOI wafers. Instead, aspects of the invention could be used with any type of wafer, including resistors formed in or on a bulk semiconductor material (e.g., silicon) substrate. For example, the resistor used in implementations of the invention may be formed on an insulator layer (e.g., an STI) formed in a bulk silicon substrate.

Figure 21:
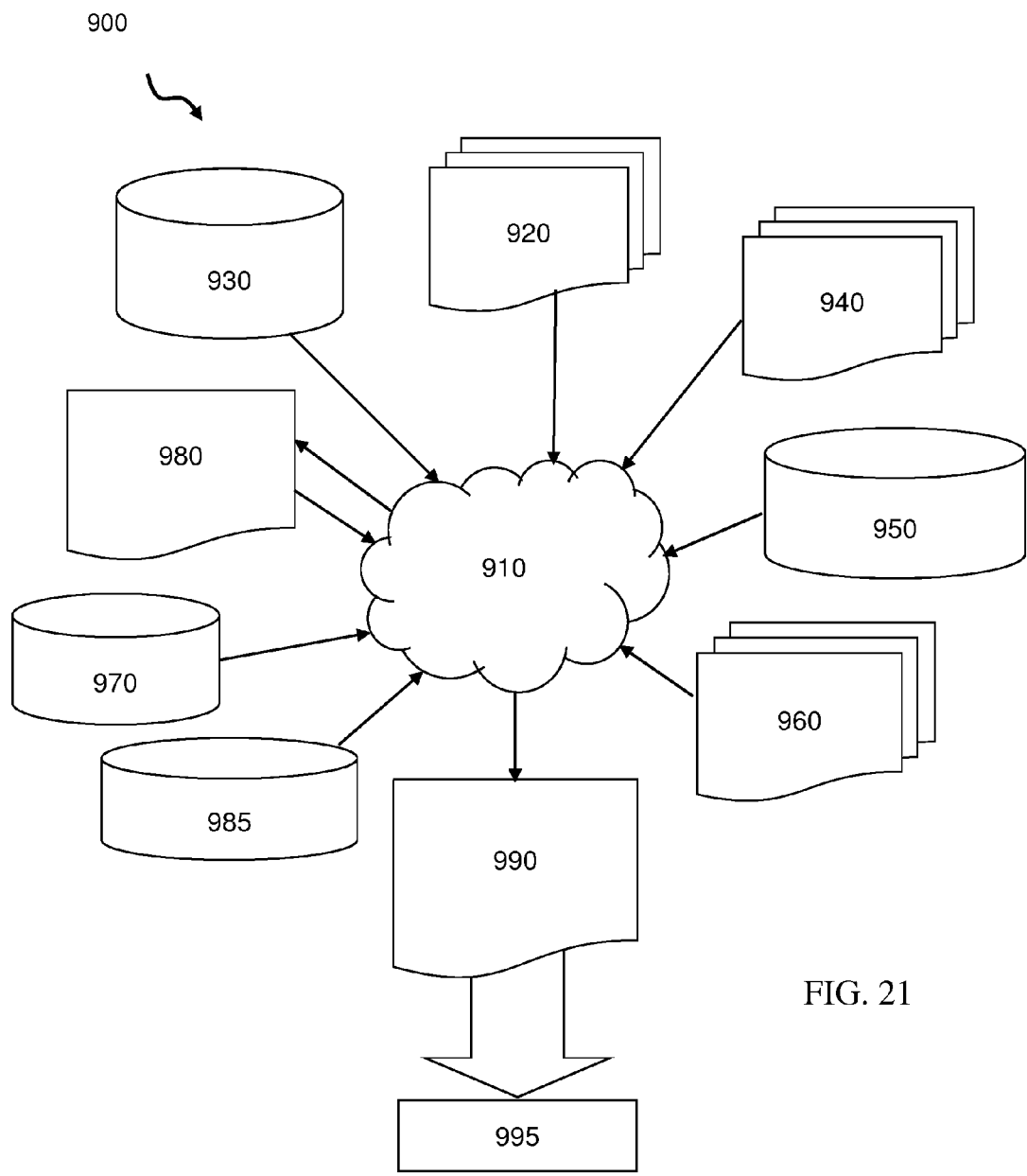
FIG. 21 is a flow diagram of a design process used in semiconductor design, manufacture, and/or test.

FIG. 21 is a flow diagram of a design process used in semiconductor design, manufacture, and/or test. FIG. 21 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-20. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-20. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-20 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-20. In one embodiment, design structure 990 may comprise a compiled, executable HDL simulation model that functionally simulates the devices shown in FIGS. 1-20.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-20. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
   forming a resistor on an insulator layer over a substrate:
   forming a trench in the resistor and into the substrate;
   forming a liner on sidewalls of the trench;
   forming a core comprising a high thermal conductivity material in the trench and on the liner;
   forming a thermal contact on the core; and
   forming a metal layer comprising a segment on the thermal contact and over a portion of the resistor.

2. The method of claim 1, further comprising forming a first resistor contact at a first end of the resistor and a second resistor contact at a second end of the resistor.

3. The method of claim 2, further comprising forming the thermal contact and the first and second resistor contacts simultaneously.

4. The method of claim 2, wherein the forming the metal layer comprises forming other segments on the first and second resistor contacts.

5. The method of claim 4, wherein:
   the other segments of the metal layer on the first and second resistor contacts provide an electrical connection to the resistor; and
   the segment of the metal layer on the thermal contact is electrically insulated from the other segments of the metal layer on the first and second resistor contacts.

6. The method of claim 1, further comprising:
   forming another trench in the resistor and into the substrate;
   forming another liner on sidewalls of the other trench;
   forming another core comprising the high thermal conductivity material in the other trench and on the other liner; and
   forming another thermal contact on the other core.

7. The method of claim 6, wherein the forming the metal layer comprises forming the segment of the metal layer on both the thermal contact and the other thermal contact.

8. The method of claim 6, further comprising forming the core and the other core with a substantially rectangular shape having a width substantially greater than a length, wherein the width is substantially parallel to a direction of current flow between first and second ends of the resistor.

9. The method of claim 1, wherein the liner on the sidewalls of the trench electrically insulates the core from the resistor, and the forming the liner on the sidewalls of the trench comprises:
   forming the liner on the sidewalls and a base of the trench; and
   removing a portion of the liner from the base of the trench to expose a portion of the substrate in the trench.

10. The method of claim 1, wherein the insulator layer comprises at least one of a shallow trench isolation and a buried oxide layer.

11. The method of claim 10, further comprising forming the liner with a thickness less than a thickness of the insulator layer between the resistor and the substrate.

12. The method of claim 1, further comprising selecting a size of the resistor and the trench to achieve a predefined resistance value of the resistor.

13. A method of forming a semiconductor structure, comprising:
forming a substrate contact trench through an insulator layer and into a substrate;
forming a core comprising a high thermal conductivity material in the substrate contact trench;
forming a capping layer on the core; and
forming a resistor on the capping layer and the insulator layer.

14. The method of claim 13, wherein the forming the capping layer comprises:
recessing a top surface of the core within the substrate contact trench to form a second trench; and
depositing or growing the capping layer in the second trench.

15. The method of claim 14, wherein the capping layer electrically insulates the core from the resistor, and further comprising forming the capping layer with a thickness less than a thickness of the insulator layer between the resistor and the substrate.

16. The method of claim 13, wherein:
the insulator layer is on and contacting a buried insulator layer;
the buried insulator layer is on and contacting the substrate; and
the trench extends through the insulator layer, through the buried insulator layer, and into the substrate.

17. The method of claim 1, wherein the core is contained within a perimeter of the resistor when viewed in plan view.

18. The method of claim 1, wherein:
the insulator layer is on and contacting a buried insulator layer;
the buried insulator layer is on and contacting the substrate; and
the trench extends through the resistor, through the insulator layer, through the buried insulator layer, and into the substrate.

19. The method of claim 1, wherein:
the forming the liner comprises: forming the liner on the sidewalls and a base of the trench; and removing a portion of the liner from the base of the trench to expose a portion of the substrate in the trench; and
the core directly contacts the substrate.

* * * * *